United States Patent
Daikuhara et al.

(10) Patent No.: US 9,780,141 B2
(45) Date of Patent: Oct. 3, 2017

(54) OPTICAL RECEIVER MODULE AND METHOD OF MAKING OPTICAL RECEIVER MODULE

(71) Applicants: FUJITSU COMPONENT LIMITED, Tokyo (JP); FUJITSU LIMITED, Kawasaki-shi, Kanagawa (JP)

(72) Inventors: Osamu Daikuhara, Tokyo (JP); Takatoshi Yagisawa, Kawasaki (JP)

(73) Assignees: FUJITSU COMPONENT LIMITED, Tokyo (JP); FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/251,050

(22) Filed: Aug. 30, 2016

(65) Prior Publication Data
US 2017/0084662 A1 Mar. 23, 2017

(30) Foreign Application Priority Data
Sep. 17, 2015 (JP) .................................. 2015-184509

(51) Int. Cl.
H04B 10/69 (2013.01)
H01L 27/146 (2006.01)
H04B 10/60 (2013.01)

(52) U.S. Cl.
CPC .. *H01L 27/14683* (2013.01); *H01L 27/14643* (2013.01); *H04B 10/60* (2013.01)

(58) Field of Classification Search
CPC .................................................... H04B 10/69
See application file for complete search history.

(56) References Cited

U.S. PATENT DOCUMENTS

| 7,171,128 | B2 | 1/2007 | Hasegawa et al. | |
| 8,891,975 | B2 | 11/2014 | Yagisawa et al. | |
| 2013/0195470 | A1* | 8/2013 | Yasuda | B29D 11/00 398/200 |
| 2015/0069220 | A1 | 3/2015 | Yagisawa | |
| 2017/0038254 | A1* | 2/2017 | Yagisawa | G01J 1/46 |

FOREIGN PATENT DOCUMENTS

| JP | 2003-134051 | 5/2003 |
| JP | 2012-142822 | 7/2012 |
| JP | 2015-056704 | 3/2015 |

\* cited by examiner

*Primary Examiner* — Shi K Li
(74) *Attorney, Agent, or Firm* — IPUSA, PLLC

(57) ABSTRACT

An optical receiver module includes a substrate, photodetectors mounted on a first surface of the substrate, amplifiers mounted on the first surface of the substrate, anode wiring patterns formed on the first surface of the substrate and configured to connect between anode terminals of the photodetectors and respective ones of the amplifiers, cathode wiring patterns formed on the first surface of the substrate and configured to connect between cathode terminals of the photodetectors and the respective ones of the amplifiers, a second electrode formed on a second surface of the substrate to cover areas directly opposite, across the substrate, the cathode wiring patterns formed on the first surface, and first vias formed through the substrate in a vicinity of connection points between the cathode wiring patterns and the amplifiers and configured to connect between the cathode wiring patterns and the second electrode.

6 Claims, 6 Drawing Sheets

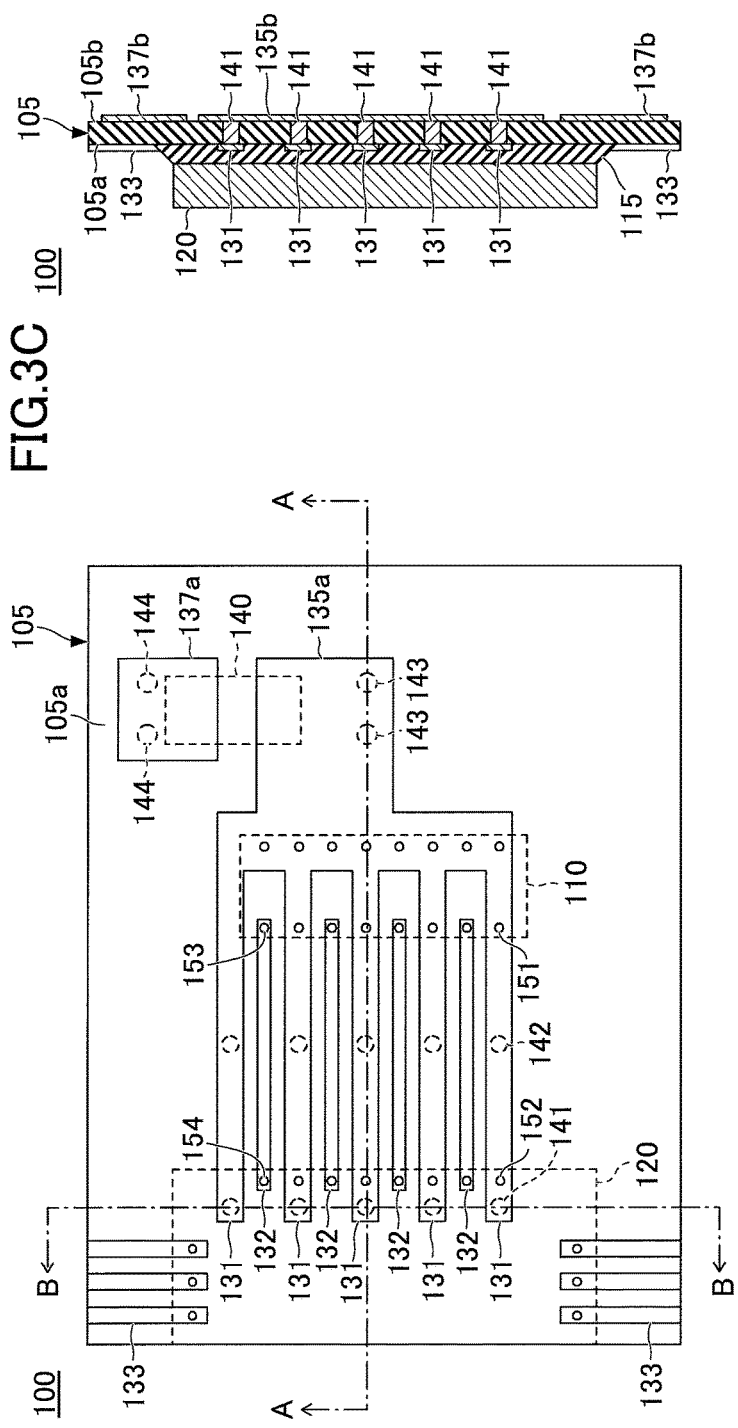
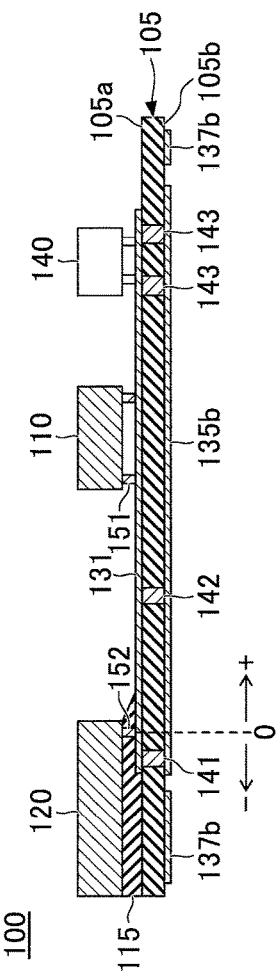
FIG.3A
FIG.3B
FIG.3C

OPTICAL RECEIVER MODULE AND METHOD OF MAKING OPTICAL RECEIVER MODULE

BACKGROUND OF THE INVENTION

1. Field of the Invention

The disclosures herein relate to an optical receiver module and a method of making an optical receiver module.

2. Description of the Related Art

A large-scale computer system and a super computer have a plurality of processing units connected together through optical interconnections for the purpose of achieving high-speed processing.

Optical interconnections include optical-fiber transmission paths and optical modules each including an optical transmitter and a photodetector, for example. An optical module generally has a plurality of optical transmitters and a plurality of optical receivers mounted on a substrate at high density for the purpose of miniaturization.

There is a technology for improving the frequency characteristics of an optical receiver module in order to enable high-speed signal transmission in such a high-density optical module (see Patent Documents 1 and 2, for example).

In order to enable high-speed signal transmission by use of an optical module, crosstalk occurring between adjacent signal lines needs to be sufficiently reduced in an optical receiver module having photodetectors mounted at high density.

It may be desirable to reduce crosstalk in an optical receiver module having a plurality of photodetectors.

[Patent Document 1] Japanese Laid-open Patent Publication No. 2003-134051

[Patent Document 2] Japanese Laid-open Patent Publication No. 2012-142822

SUMMARY OF THE INVENTION

It is a general object of the present invention to provide an optical receiver module and a method of making an optical receiver module that substantially obviate one or more problems caused by the limitations and disadvantages of the related art.

According to an embodiment, an optical receiver module includes a substrate, a plurality of photodetectors mounted on a first surface of the substrate, a plurality of amplifiers mounted on the first surface of the substrate, a plurality of anode wiring patterns formed on the first surface of the substrate and configured to connect between anode terminals of the photodetectors and respective ones of the amplifiers, a plurality of cathode wiring patterns formed on the first surface of the substrate and configured to connect between cathode terminals of the photodetectors and the respective ones of the amplifiers, a second electrode formed on a second surface of the substrate to cover areas directly opposite, across the substrate, the plurality of cathode wiring patterns formed on the first surface, and a plurality of first vias formed through the substrate in a vicinity of connection points between the cathode wiring patterns and the amplifiers and configured to connect between the cathode wiring patterns and the second electrode.

According to an embodiment, a method of making a receiver module, which includes photodetectors and amplifiers mounted on a substrate, includes forming a plurality of anode wiring patterns on a first surface of the substrate to connect between anode terminals of the photodetectors and respective ones of the amplifiers, forming a plurality of cathode wiring patterns on the first surface of the substrate to connect between cathode terminals of the photodetectors and respective ones of the amplifiers, forming a second electrode on a second surface of the substrate to cover areas directly opposite, across the substrate, the plurality of cathode wiring patterns formed on the first surface, and forming a plurality of first vias through the substrate in a vicinity of connection points between the cathode wiring patterns and the amplifiers to connect between the cathode wiring patterns and the second electrode.

According to an embodiment, a receiver module includes a substrate, photodetectors mounted on the substrate, amplifiers mounted on the substrate, a plurality of anode wiring patterns formed on a first surface of the substrate and configured to connect between anode terminals of the photodetectors and respective ones of the amplifiers, a plurality of cathode wiring patterns formed on the first surface of the substrate and configured to connect between cathode terminals of the photodetectors and the respective ones of the amplifiers, a second electrode formed on a second surface of the substrate to cover areas directly opposite, across the substrate, areas of the plurality of cathode wiring patterns formed on the first surface, and vias formed through the substrate in a vicinity of connection points between the cathode wiring patterns and the amplifiers and configured to connect between the cathode wiring patterns and the second electrode.

Other objects and further features of the present invention will be apparent from the following detailed description when read in conjunction with the accompanying drawings.

BRIEF DESCRIPTION OF THE DRAWINGS

FIGS. 3A through 3C are drawings illustrating an example of the configuration of the receiver module according to the embodiment;

DESCRIPTION OF THE PREFERRED EMBODIMENTS

In the following, embodiments will be described by referring to the accompanying drawings. In these drawings, the same elements are referred to by the same references, and a description thereof may be omitted.

<Configuration of Optical Transceiver Module>

Figure 1:
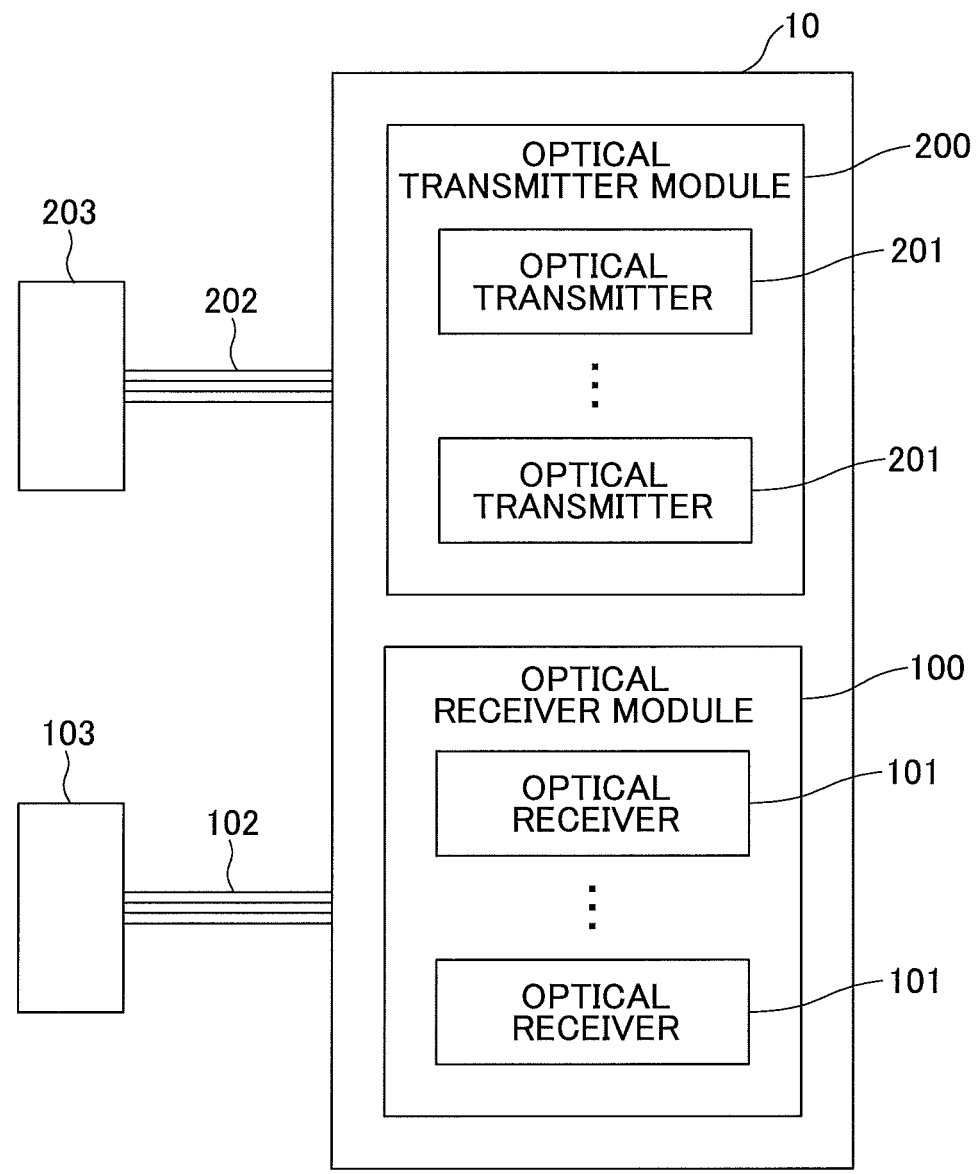
FIG. 1 is a drawing illustrating an example of the configuration of an optical transceiver module according to an embodiment.

FIG. 1 is a drawing illustrating an example of the configuration of an optical transceiver module according to an embodiment. An optical transceiver module 10 includes a receiver module 100 and a transmitter module 200 as illustrated in FIG. 1.

The receiver module 100 includes a plurality of receivers 101. Each receiver 101 includes a photodetector and an amplifier for amplifying an electric signal output from the photodetector. The receiver module 100 is optically coupled to a receiver waveguide 102, which includes a plurality of optical waveguides provided in one-to-one correspondence with the receivers 101. The tip of the receiver waveguide 102 has a connector 103 mounted thereon. The connector 103 may be coupled to optical fibers for guiding optical signals, for example. The receiver waveguide 102 guides optical signals from the connector 103 to the receiver module 100.

The transmitter module 200 includes a plurality of transmitters 201. Each transmitter 201 includes a laser light source and a drive circuit for driving the laser light source, and generates an optical signal from a received data signal. The transmitter module 200 is optically coupled to a transmitter waveguide 202, which includes a plurality of optical waveguides provided in one-to-one correspondence with the transmitters 201. The tip of the transmitter waveguide 202 has a connector 203 mounted thereon. The connector 203 may be coupled to optical fibers for guiding optical signals, for example. The transmitter waveguide 202 guides optical signals generated by the transmitter module 200 to the connector 203.

The receiver waveguide 102 and the transmitter waveguide 202 may be polymer waveguides, for example. The connector 103 and the connector 203 may be MT connectors or PMT connectors, for example.

<Configuration of Receiver Module>

Figure 2:
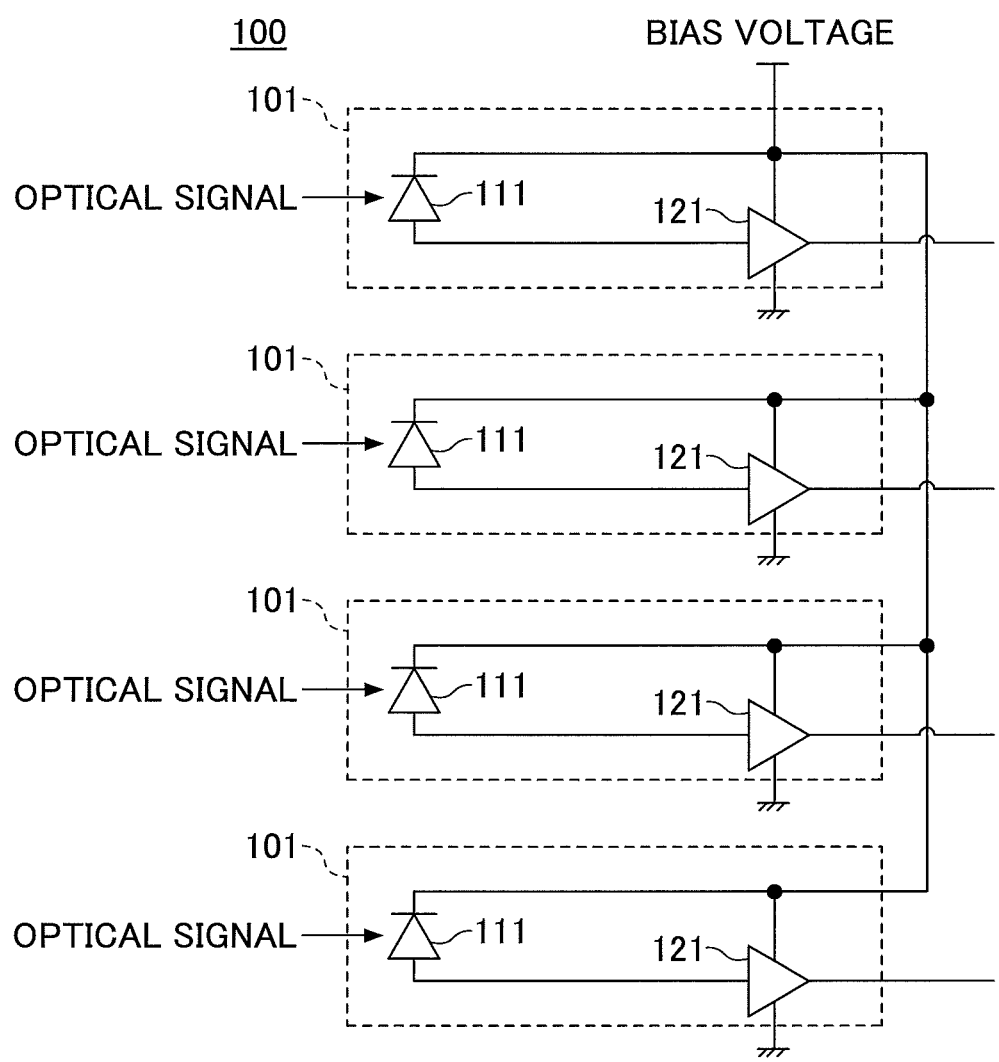
FIG. 2 is a drawing illustrating an example of the configuration of a receiver module according to the embodiment.

FIG. 2 is a drawing illustrating an example of the configuration of the receiver module 100 according to the embodiment.

As illustrated in FIG. 2, the receiver module 100 of the present embodiment includes four receivers 101. It may be noted that the number of receivers 101 provided in the receiver module 100 is not limited to four.

The receiver 101 includes a photodetector 111 and an amplifier 121. The photodetector 111 may be a photodiode (PD) having an anode terminal and a cathode terminal. The amplifier 121 may be a trans-impedance amplifier (TIA) having a signal input terminal, a signal output terminal, a bias terminal, and a ground terminal.

The anode terminal of the photodetector 111 is electrically coupled to the signal input terminal of the amplifier 121. The cathode terminal of the photodetector 111 is electrically coupled to the bias terminal of the amplifier 121. Applying a bias potential to the bias terminal of the amplifier 121 causes the bias potential to be also applied to the cathode terminal of the photodetector 111.

As an optical signal is applied to the photodetector 111, an electric current signal having an intensity responsive to the intensity of the applied optical signal is supplied to the signal input terminal of the amplifier 121. The amplifier 121 amplifies the electric current signal generated by the photodetector 111 and outputs the amplified signal from the signal output terminal.

Figure 4:
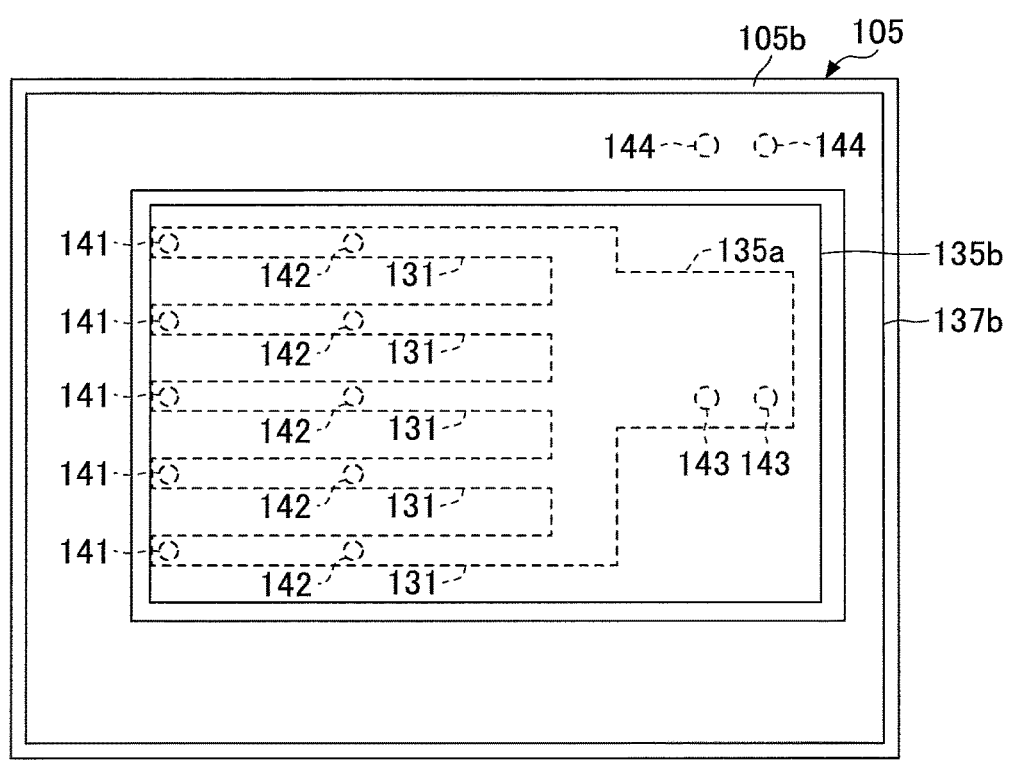
FIG. 4 is a bottom view illustrating an example of the configuration of the receiver module according to the embodiment.

FIGS. 3A through 3C are drawings illustrating an example of the configuration of the receiver module 100 according to the embodiment. FIG. 3A is a plan view of the receiver module 100. FIG. 3B is a cross-sectional view taken along the line A-A illustrated in FIG. 3A. FIG. 3C is a cross-sectional view taken along the line B-B illustrated in FIG. 3A. FIG. 4 is a drawing illustrating the receiver module 100 according to the embodiment.

As illustrated in FIG. 3A and FIG. 3B, the receiver module 100 has a photo-receiving module 110, an amplifier module 120, and a capacitive element 140 mounted on a first surface 105a of a substrate 105 by use of flip-chip mounting, for example. In FIG. 3A, the photo-receiving module 110, the amplifier module 120, and the capacitive element 140 are illustrated by dotted lines.

The photo-receiving module 110 has a plurality of photodetectors. The amplifier module 120 includes a plurality of amplifiers that are provided in one-to-one correspondence with the photodetectors of the photo-receiving module 110. The amplifier module 120 is fixedly attached to the substrate 105 through underfill 115 that fills a space between the substrate 105 and the amplifier module 120.

As illustrated in FIG. 3A, a plurality of cathode wiring patterns 131, a plurality of anode wiring patterns 132, control signal lines 133, a first bias electrode 135a, and a first ground electrode 137a are formed on the first surface 105a.

The cathode wiring patterns 131 and the first bias electrode 135a are formed as a unitary, continuous part. The cathode wiring patterns 131 extend like comb teeth from the first bias electrode 135a.

The cathode wiring patterns 131 and the anode wiring patterns 132 are alternately formed such that each of the anode wiring patterns 132 is situated between two adjacent cathode wiring patterns 131.

The cathode wiring patterns 131 are coupled to the cathode terminals of the photodetectors of the photo-receiving module 110 through PD-cathode connections 151, respectively. Further, the cathode wiring patterns 131 are coupled to the bias terminals of the amplifiers of the amplifier module 120 through TIA-cathode connections 152, respectively. The cathode wiring patterns 131 provide electrical couplings between the cathode terminals of the photodetectors and the bias terminals of the amplifiers through the PD-cathode connections 151 and the TIA-cathode connections 152, respectively.

The anode wiring patterns 132 are coupled to the anode terminals of the photodetectors of the photo-receiving module 110 through PD-anode connections 153, respectively. Further, the anode wiring patterns 132 are coupled to the signal input terminals of the amplifiers of the amplifier module 120 through TIA-anode connections 154, respectively. The anode wiring patterns 132 provide electrical couplings between the anode terminals of the photodetectors and the signal input terminals of the amplifiers through the PD-anode connections 153 and the TIA-anode connections 154, respectively.

The photodetectors of the photo-receiving module 110 and the amplifiers of the amplifier module 120 are coupled to each other through the cathode wiring patterns 131 and the anode wiring patterns 132, respectively, to form the receiver 101 as illustrated in FIG. 2.

The control signal lines 133 are electrically coupled to the control terminals of the amplifier module 120 to provide control signals to the amplifier module 120.

The first bias electrode 135a formed as a unitary, continuous part with the cathode wiring patterns 131 receives a bias potential. Further, the first bias electrode 135a is coupled to the first ground electrode 137a through the capacitive element 140.

A second bias electrode 135b and a second ground electrode 137b are formed on a second surface 105b of the substrate 105 as illustrated in FIG. 4. FIG. 4 illustrates the cathode wiring patterns 131 and the first bias electrode 135a formed on the first surface 105a in dotted lines.

The second bias electrode 135b is formed such as to cover all the areas directly opposite to an area of the first surface 105, across the substrate 105, in which the cathode wiring patterns 131 and the first bias electrode 135a are formed.

The second ground electrode 137b is formed along the perimeter of the substrate 105 to enclose the second bias electrode 135b.

As illustrated in FIG. 3 and FIG. 4, the cathode wiring patterns 131 are coupled to the second bias electrode 135b through first vias 141 and second vias 142.

Further, the first bias electrode 135a and the second bias electrode 135b are coupled to each other through electrode vias 143.

At least one of the first bias electrode 135a and the second bias electrode 135b receives a bias potential from a power supply source (not illustrated), and are set to the same bias potential due to the couplings provided therebetween through the electrode vias 143. Moreover, the cathode wiring patterns 131 receive the bias potential from the first bias electrode 135a formed as a unitary, continuous extension thereof and from the second bias electrode 135b to which couplings are provided through the first vias 141 and the second vias 142.

The first ground electrode 137a formed on the first surface 105a is coupled to the second ground electrode 137b formed on the second surface 105b through ground vias 144. At least one of the first ground electrode 137a and the second ground electrode 137b receive a ground potential, and are set to the same ground potential due to the couplings provided therebetween through the ground vias 144.

A receiver module of the present embodiment has the anode wiring patterns 132 each of which is situated between two adjacent cathode wiring patterns 131 to which the same bias potential is applied. This configuration serves to reduce crosstalk between the adjacent anode wiring patterns 132.

As illustrated in FIG. 3A and FIG. 3B, the first vias 141 are situated close to the TIA-cathode connections 152, i.e., situated in the vicinity of the connection points between the cathode wiring patterns 131 and the bias terminals of the amplifiers. The cathode wiring patterns 131 are coupled to the second bias electrode 135b through the first vias 141 in the vicinity of the connection points to the bias terminals of the amplifiers, which ensures that the potential fluctuation between the photodetectors and the amplifiers is sufficiently reduced, and, thus, the cathode wiring patterns 131 are set to a constant bias potential.

The arrangement that the bias potential of the cathode wiring patterns 131 between the photodetectors and the amplifiers are kept constant serves to reduce fluctuations in the voltage generated between the cathode wiring patterns 131 and the anode wiring patterns 132, thereby improving the effect to reduce crosstalk. As a result, such an arrangement enhances the high-speed characteristics of signal transmission in the receiver module 100.

Figure 5:
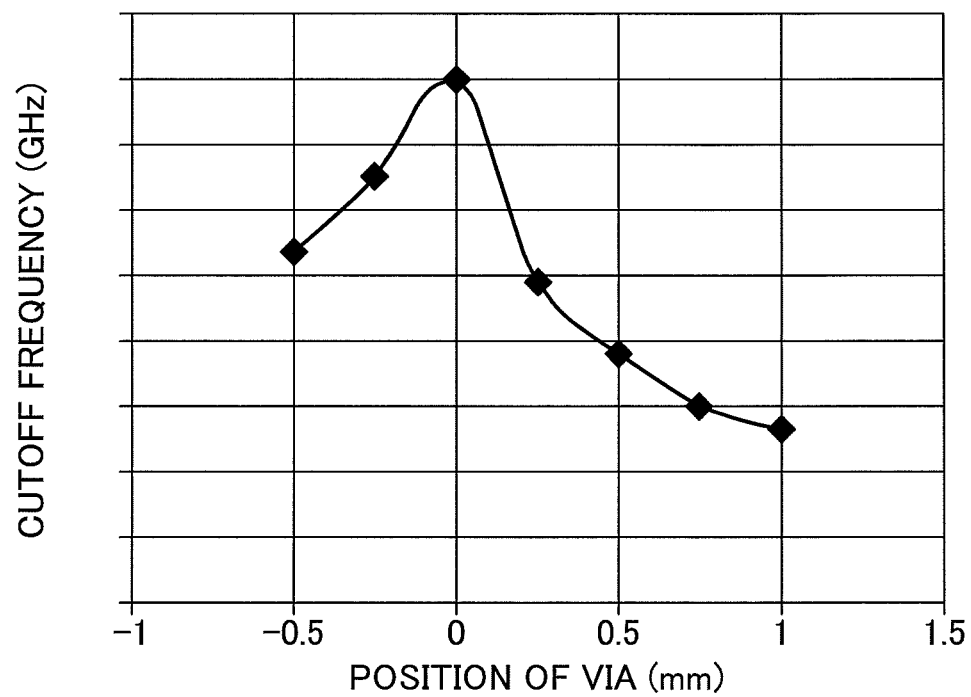
FIG. 5 is a drawing illustrating an example of the relationship between the cutoff frequency and the position of first vias.

FIG. 5 is a drawing illustrating an example of the relationship between the cutoff frequency and the position of the first vias 141 in the present embodiment. In FIG. 5, the horizontal axis represents the position of the first vias 141, and the vertical axis represents the cutoff frequency.

The zero point of the position of the first vias 141 corresponds to the position of the TIA-cathode connections 152 that provide couplings between the cathode wiring patterns 131 and the bias terminals of the amplifiers of the amplifier module 120 as illustrated in FIG. 3B. A position situated toward the photo-receiving module 110 relative to the zero point in the longitudinal direction of the cathode wiring patterns 131 is denoted as the plus side (+), and a position situated away from the photo-receiving module 110 relative to the zero point is denoted as the minus side (−).

The cutoff frequency is a value that was obtained from the simulated results of S parameters with respect to the cathode wiring patterns 131 of the receiver module 100 of the present embodiment.

As illustrated in FIG. 5, the cutoff frequency is the highest when the first vias 141 are situated at the same position as the TIA-cathode connections 152, and exhibits a drop that increases as the distance between the first vias 141 and the TIA-cathode connections 152 increases. As is understood from the above, the provision of the first vias 141 situated in the vicinity of the TIA-cathode connections 152 ensures the high-speed characteristics of signal transmission in the receiver module 100.

Further, the first vias 141 are preferably situated within a distance of ±0.5 mm from the position of the TIA-cathode connections 152 in the longitudinal direction of the cathode wiring patterns 131, for example.

The first vias 141 are preferably formed as a filled via that is a through-hole formed through the substrate 105 and filled with copper plating, i.e., preferably formed as a plugged hole. The first vias 141 may be formed by filling through-holes with filling material. These forming methods are non-limiting examples.

The first vias 141 are formed in the vicinity of the TIA-cathode connections 152 that are situated between the amplifier module 120 and the first surface 105a of the substrate 105 as previously described. If the first vias 141 are formed as through-holes, the underfill 115 filling the space between the substrate 105 and the amplifier module 120 may have a risk of leaking to the second surface 105b through the first vias 141. The use of the first vias 141 formed as filled vias prevents the underfill 115 from leaking to the second surface 105b.

The second vias 142 for connecting the cathode wiring patterns 131 and the second bias electrode 135b are situated at a point, preferably at the midpoint, between the photosensitive module 110 and the amplifier module 120 as illustrated in FIG. 3A and FIG. 3B. The provision of the second vias 142 at or around such a position causes the potential fluctuation of the cathode wiring patterns 131 to be further reduced, thereby maintaining an even distribution of the bias potential.

Accordingly, crosstalk between adjacent anode wiring patterns 132 is reduced to ensure the superior high-speed characteristics of signal transmission in the high-density receiver module 100.

Further, the substrate 105 may have one or more vias for providing additional connections between the cathode wiring patterns 131 and the second bias electrode 135b in addition to the first vias 141 and the second vias 142.

<Method of Making Receiver Module>

FIGS. 6A through 6E are drawings illustrating an example of the method of making the receiver module 100 according to the embodiment. FIGS. 6A through 6E illustrate views corresponding to a cross-sectional view taken along the line A-A illustrated in FIG. 3A.

Figure 6A:
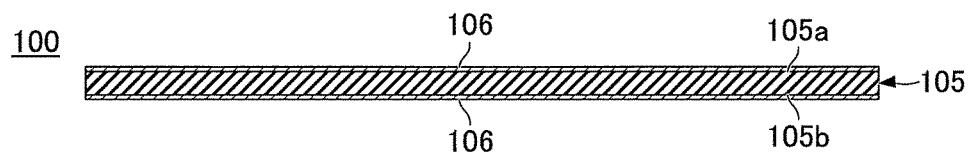
FIGS. 6A through 6E are drawings illustrating an example of the method of making the receiver module according to the embodiment.

As illustrated in FIG. 6A, copper foils 106 are disposed on the first surface 105a and the second surface 105b of the substrate 105, respectively. The substrate 105 is a resin film made of polyimide or the like.

Figure 6B:
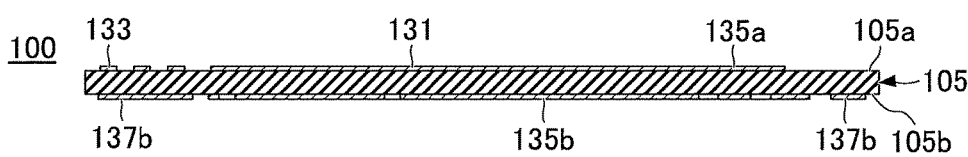

The copper foils 106 are partially removed from the substrate by etching, for example, which forms wiring patterns and electrode patterns on the first surface 105a and the second surface 105b as illustrated in FIG. 6B.

The cathode wiring patterns 131 and the patterns of the control signal lines 133 and the first bias electrode 135a are formed on the first surface 105a. Further, the anode wiring patterns 132 and the first ground electrode 137a (not shown in FIG. 6) are also simultaneously formed on the first surface 105a. The patterns of the second bias electrode 135b and the second ground electrode 137b are formed on the second surface 105b.

Figure 6C:
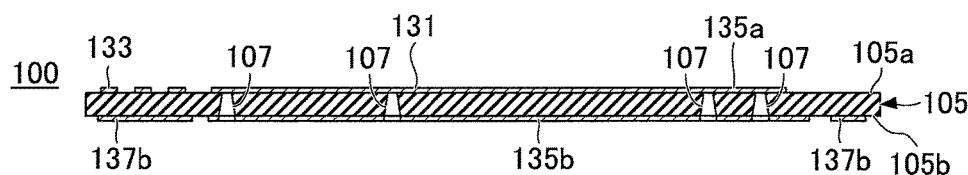

Subsequently, through-holes 107 are formed in the substrate 105 by etching, for example, as illustrated in FIG. 6C. The through-holes 107 constitute the first vias 141, the second vias 142, and the electrode vias 143. The through-holes 107 are formed from the second surface 105b, and have the end thereof closed by the cathode wiring patterns 131 or the first bias electrode 135a at the first surface 105a.

Simultaneously with forming the through-holes 107, openings may be formed in the substrate 105 for allowing the photodetectors to receive optical signals having propagated through optical waveguides formed on the second surface 105b.

Figure 6D:
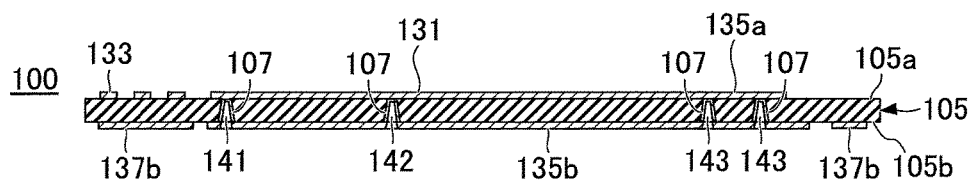

Subsequently, copper plating is performed to form a copper plating layer on the inner surface of each of the through-holes 107, thereby forming the first vias 141, the second vias 142, and the electrode vias 143 as illustrated in FIG. 6D. It may be noted that the ground vias 144 (not shown in FIG. 6D) are also simultaneously formed.

Figure 6E:
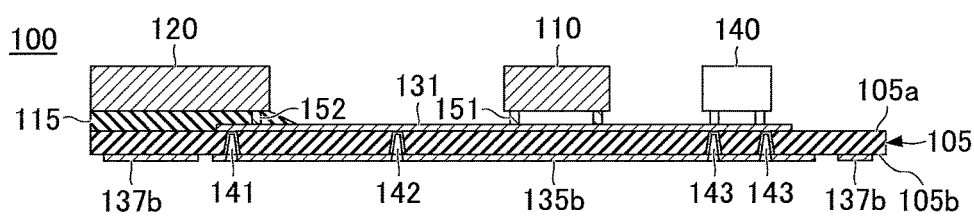

Subsequently, the photo-receiving module 110, the amplifier module 120, and the capacitive element 140 are mounted on the first surface 105a as illustrated in FIG. 6E by use of flip-chip mounting. Further, the underfill 115 fills the space between the amplifier module 120 and the first surface 105a to secure the receiver waveguide 102 to the first surface 105a.

The photo-receiving module 110 is coupled to the cathode wiring patterns 131 through the PD-cathode connections 151, and to the anode wiring patterns 132 through the PD-anode connections 153 (not shown in FIG. 6E). The amplifier module 120 is coupled to the cathode wiring patterns 131 through the TIA-cathode connections 152, and to the anode wiring patterns 132 through the TIA-anode connections 154 (not shown in FIG. 6E).

Prior to mounting the photo-receiving module 110 and the like, solder resist or the like may be applied to the portions of the cathode wiring patterns 131 and the like that are to be exposed on the first surface 105a. For the purpose of preventing the corrosion of the cathode wiring patterns 131 and the like and for the purpose of improving the strength of contact with the photo-receiving module 110, gold plating or the like may be applied to the exposed portions of the cathode wiring patterns 131 and the like on the substrate 105 where the solder resist has been applied.

The receiver waveguide for guiding optical signals to be supplied to the photodetectors and a lens sheet for converging the optical signals of the receiver waveguide on the photodetectors are disposed on the second surface 105b of the substrate 105.

The receiver module 100 of the present embodiment is made by the process steps, which were described above as examples. The sequence of these process steps may be changed, and one or more additional steps may be added.

As has been described heretofore, the receiver module 100 of the present embodiment has the first vias 141 formed in the vicinity of the TIA-cathode connections 152, which serves to reduce fluctuations in the potential of the cathode wiring patterns 131 between the photodetectors and the amplifiers. Accordingly, crosstalk is reduced between the anode wiring patterns 132 each of which is formed between adjacent cathode wiring patterns 131, thereby enhancing the high-speed characteristics of signal transmission. Further, the first vias 141 situated in the vicinity of the TIA-cathode connections 152 are formed as filled vias, thereby preventing the underfill 115 filling the space between the amplifier module 120 and the first surface 105a of the substrate 105 from leaking to the second surface 105b.

Although the receiver module and the method of making the receiver module have heretofore been described according to the embodiments, the present invention is not limited to those embodiments. Various changes and modifications may be made without departing from the scope of the invention.

According to at least one embodiment, crosstalk is reduced in a receiver module having a plurality of photodetectors.

Further, the present invention is not limited to these embodiments, but various variations and modifications may be made without departing from the scope of the present invention.

The present application is based on and claims the benefit of priority of Japanese priority application No. 2015-184509 filed on Sep. 17, 2015, with the Japanese Patent Office, the entire contents of which are hereby incorporated by reference.

What is claimed is:

1. An optical receiver module, comprising:
   a substrate;
   a plurality of photodetectors mounted on a first surface of the substrate;
   a plurality of amplifiers mounted on the first surface of the substrate;
   a plurality of anode wiring patterns formed on the first surface of the substrate and configured to connect between anode terminals of the photodetectors and respective ones of the amplifiers;
   a plurality of cathode wiring patterns formed on the first surface of the substrate and configured to connect between cathode terminals of the photodetectors and the respective ones of the amplifiers;
   a second electrode formed on a second surface of the substrate to cover areas directly opposite, across the substrate, an area of the first surface where the plurality of cathode wiring patterns are formed; and
   a plurality of first vias formed through the substrate in a vicinity of connection points between the cathode wiring patterns and the amplifiers and configured to connect between the cathode wiring patterns and the second electrode.

2. The optical receiver module as claimed in claim 1, wherein the first vias are formed as filled vias that are plugged through-holes, and the amplifiers are mounted on the first surface of the substrate by use of flip-chip mounting, with underfill filling a space between the amplifiers and the first surface of the substrate.

3. The optical receiver module as claimed in claim 1, further comprising a plurality of second vias formed through the substrate at a position between the photodetectors and the amplifiers, and configured to connect between the cathode wiring patterns and the second electrode.

4. The optical receiver module as claimed in claim 1, wherein the plurality of cathode wiring patterns extending in a comb-teeth shape from a first electrode, the first electrode being formed on the first surface of the substrate and connected to the second electrode, and each of the plurality of anode wiring patterns is situated between two adjacent ones of the cathode wiring patterns.

5. A method of making an optical receiver module which includes photodetectors and amplifiers mounted on a substrate, comprising:

forming a plurality of anode wiring patterns on a first surface of the substrate to connect between anode terminals of the photodetectors and respective ones of the amplifiers;

forming a plurality of cathode wiring patterns on the first surface of the substrate to connect between cathode terminals of the photodetectors and respective ones of the amplifiers;

forming a second electrode on a second surface of the substrate to cover areas directly opposite, across the substrate, the plurality of cathode wiring patterns formed on the first surface; and forming a plurality of first vias through the substrate in a vicinity of connection points between the cathode wiring patterns and the amplifiers to connect between the cathode wiring patterns and the second electrode.

6. An optical receiver module, comprising:
a substrate;
a photodetector mounted on the substrate;
an amplifier mounted on the substrate;
an anode wiring pattern formed on a first surface of the substrate and configured to connect between an anode terminal of the photodetector and the amplifier;
a cathode wiring pattern formed on the first surface of the substrate and configured to connect between a cathode terminal of the photodetector and the amplifier;
a second electrode formed on a second surface of the substrate to cover an area directly opposite the cathode wiring pattern formed on the first surface; and
a via formed through the substrate in a vicinity of connection point between the cathode wiring pattern and the amplifier and configured to connect between the cathode wiring pattern and the second electrode.

* * * * *